(12) United States Patent
Koivusilta

(10) Patent No.: US 6,831,224 B2
(45) Date of Patent: Dec. 14, 2004

(54) ONE-PIECE MANUFACTURED SHIELDING CASING FOR ACCOMMODATING ELECTRONIC FUNCTIONAL ELEMENTS

(75) Inventor: Raimo Koivusilta, Turku (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/424,546

(22) Filed: Apr. 25, 2003

(65) Prior Publication Data

US 2004/0211579 A1 Oct. 28, 2004

(51) Int. Cl.[7] .................................................. H05M 9/00
(52) U.S. Cl. .............................. 174/35 GC; 174/35 R; 361/816
(58) Field of Search ........................ 174/35 R, 35 GC, 174/35 MS, 50; 361/816, 818, 752, 753, 799, 800

(56) References Cited

U.S. PATENT DOCUMENTS 5,614,694 A * 3/1997 Gorenz et al. ............ 174/35 R
6,136,131 A * 10/2000 Sosnowski ................. 156/256
6,178,097 B1 * 1/2001 Hauk, Jr. .................... 361/816
6,274,808 B1 * 8/2001 Cercioglu et al. ...... 174/35 GC
6,329,014 B1    12/2001 Kahl et al.

* cited by examiner

Primary Examiner—Dean A. Reichard
Assistant Examiner—Carmelo Oliva
(74) Attorney, Agent, or Firm—Ware, Fressola, Van der Sluys & Adolphson LLP

(57) ABSTRACT

A one-piece manufactured shielding casing is provided for accommodating electronic functional elements. The shielding casing has a functional lid, which is manufactured in the top of the one-piece manufactured shielding casing so the lid is a functional part of the one-piece manufactured shielding casing. The lid can be breakably and releasably opened yet maintain a bendable hinge. Weakening or a groove is manufactured, for example by die-cutting or stamping the plate thereby forming frames for the lid in the top of the shielding casing. These position frames can be breakably released. A certain side of the lid is made by manufacturing a stronger weakening to the plate that shall establish the bendable hinge for the lid.

25 Claims, 8 Drawing Sheets

ONE-PIECE MANUFACTURED SHIELDING CASING FOR ACCOMMODATING ELECTRONIC FUNCTIONAL ELEMENTS

TECHNICAL FIELD OF THE INVENTION

The present invention relates generally to electronics, electronics circuits or devices and, more particularly to shielding for such things.

BACKGROUND OF THE INVENTION

Electronic components, circuits or devices and also measuring, detection and similar devices sensitive to interference by electromagnetic radiation require a screen against the electromagnetic fields present at the operational site in order to ensure a problem free operation. They are therefore accommodated in screening cases which comprise conductive material in the walls and act as a Faraday cage.

Such casings are also used for equipment or components which, themselves, emit electromagnetic rays that must be excluded from the environment, in order for example, to prevent the emission of secret information or the malfunction of external appliances. Moreover, such casings can be used for equipment which can cause a fire safety problem by shielding the environment in case the equipment inside the casing causes the fire safety problem situation by, for example a short cut or over heating, etc. As the electromagnetic shielding, the fire shielding can also work vice versa protecting the electrical device inside.

Today such a screening against the emission or irradiation of EMI must be more effective the more electronic apparatuses are operated and the greater the proximity at which these apparatuses must operate next to each other. Finally, the continuous increase in performance and sensitivity of such equipment also necessitates an improvement of the screening measures for which increasingly less space is available, since the relevant appliances must, moreover, be miniaturized. Thus, apart from the actual operational properties of electronic appliances, the "electromagnetic compatibility" thereof is today a significant factor determining quality. In addition, for some thorough shielding there must be robust and completely surrounding shielding for, for example for fire protection. Thus, the shielding situation can vary from micro- to complete use device approach.

If, as is mostly the case in practice, the casings are multi-part constructions which must be capable of being opened occasionally (e.g. in order to renew the energy source or for maintenance purposes), it is necessary to provide the parts of the casing to be separated from each other during opening and to be reconnected again during closing, with any kind of seals, e.g. elastic conductive seals, by screws or fastening, or by a complex mechanical structure such as lids with some kind of locking mechanism in order to achieve an effective screening.

A problem with the multi-part construction of the casing is that as there are many pieces or more than one piece, they are complex and complex in structure, and, therefore, expensive to manufacture. This is especially significant when the manufactured amounts are in millions as the case typically is in commonplace electrical devices.

A patent publication U.S. Pat. No. 6,329,014 B1 presents one approach to provide a screening seal to fill a gap between two adjacent housing parts for accommodating electronic functional elements therein. However, there is still being required at least two parts for the casing, namely a housing (reference numeral 1 in the publication) or casing and a lid, a cap or a cover (reference numeral 4 in the publication), and the essential seal therebetween. The structure of the reference is complex, for example the manufactured mechanical hinge is required hinging the housing and the cover.

In view of various inherent limitations of shielding cans and casings, it would be desirable to avoid or mitigate these and other problems associated with prior art systems. Thus, there is a need for techniques to provide a encapsulation for electrical component(s) in one piece manufacture.

SUMMARY OF THE INVENTION

Now a method and an encapsulation have been invented where the encapsulation for electrical component(s) is provided in one piece manufacture.

In accordance with a aspects of the invention there is provided a one-piece manufactured shielding casing for accommodating electronic functional elements, comprising: a functional lid which is adapted to be manufactured to the one-piece manufactured shielding casing in such a way that the lid comprises a functional part of the one-piece manufactured shielding casing, and the lid can be breakably and releasably opened yet maintaining a bendable hinge.

In a preferred arrangement, a thin-film manufacture is provided for shielding electronic functional element(s) from interference or a fire. The manufactured shielding casing is made in a complete one-piece manufacture containing both a housing and a functional lid or a cover in one piece. When manufactured, the shielding casing contains the electronic functional element inside ready for application as shielded.

A benefit of the embodied invention provides a solution where the complete shielding casing is a single manufactured item. The shielding housing does not have to be removed from the module. There is also provided a more manufacturing friendly solution as the entire shielding casing is ready for operation to shield the electronic functional element and is cheaper to manufacture. This reflects to the entire production line, as production is more adroit, design can be more flexible and required tools for manufacture are simpler. In addition, in a manufacturing process the shielding casing can be moved from the eccentric or off-center press to the reel, and no addition temporary intermediate storage is required in the manufacturing process. Moreover, if compared to the two-piece manufacture, no specific manufacture processes for two components (cover and housing) are required.

For better understanding of the present invention reference is made to the following description, taken in conjunction with the accompanying drawings, and its scope will be pointed out in the appending claims.

BRIEF DESCRIPTION OF THE DRAWINGS

The invention will now be described, by way of example only, with reference to the accompanying drawings, in which.

DETAILED DESCRIPTION OF THE EMBODIMENTS

The preferred embodiments of the invention provide a one-piece manufactured shielding casing for accommodating electronic functional elements. The shielding casing comprises a functional lid, which is adapted to be manufactured to the top of the one-piece manufactured shielding casing in such a way that said lid comprises a functional part of the one-piece manufactured shielding casing. The lid can be breakably and releasably opened yet maintain a bendable hinge. Weakening(s) or grooves are manufactured, for example by die-cutting or stamping the plate thereby forming frames for the lid in the top of the shielding casing. These position frames can be breakably released. A certain side of the lid is made by manufacturing a stronger weakening to the plate that shall establish the bendable hinge for the lid.

In the preferred embodiment, a thin-film manufacture is provided for shielding electronic functional element(s) from interference or a fire. In some embodiments the thin-film manufacture can, for example, be metal. The manufactured shielding casing is made in a complete one-piece manufacture containing both a housing and a functional lid or a cover in one piece. When manufactured, the shielding casing contains the electronic functional element inside ready for appliance as shielded.

Some embodiments of the invention apply the electronic functional element(s). The electronic functional is accommodated in the screening casing. The electronic functional element can be an electronic component or an electronic circuit. The electronic functional element can also be an electronic device or product such as a mobile phone, a set top box for digital television, a television receiver, etc. As the size of the electronic functional element may vary considerably, the size of the screening casing will vary accordingly from a micro-size to covering or screening the product even up to the entire device.

Some embodiments of the invention apply the screening casing for accommodating and shielding the electronic functional element(s). The screening casing is a thin-film manufacture. Preferably, the screening casing can be made of metal, for example made of tined steel plate. As one alternative, the screening casing can be of nickel silver. It should be noted that the materials are not limited to the examples given but can vary within the limits of the shielding or protecting functionalities of the screening casing. The screening casing function as a faraday cage for the electrical element contained therein. Thus, a conducting, fire proof and moldable material can be applied. Alternatively, the screening casing can act as a fire safety for the environment of the electrical element inside the casing or vice versa. The screening casing is manufactured in one piece, so when the screening casing is ready for use accommodating the electrical functional element therein, it is comprised as a one-piece structure.

Figure 1:
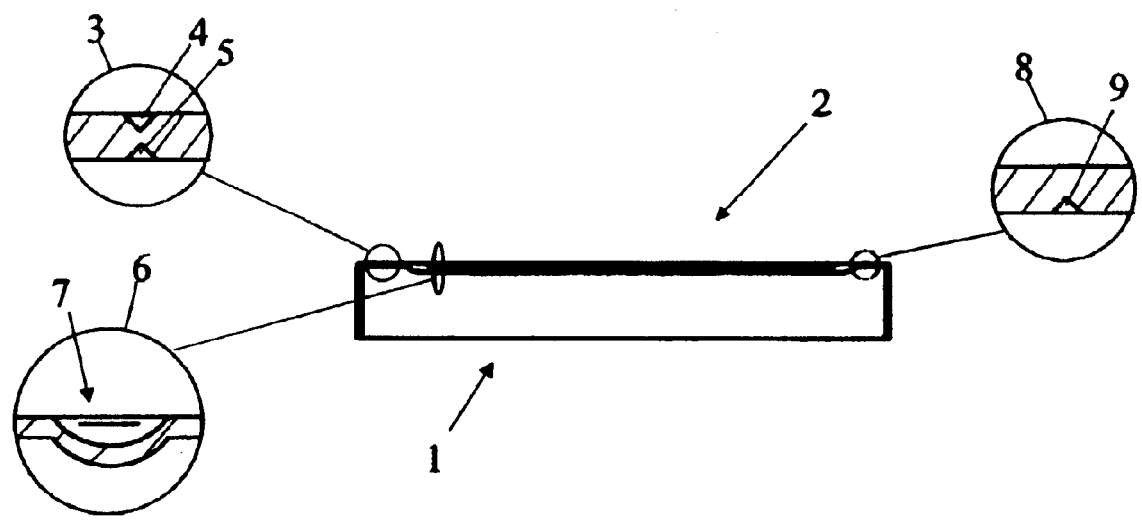
FIG. 1 depicts a cross-section diagram of a casing in accordance with an embodiment of the invention.

FIG. 1 has been described in the foregoing. In the following, corresponding reference signs have been applied to corresponding parts. FIG. 1 shows the screening casing 1 for accommodating the electronic functional element. The screening casing 1 has a functional cover or lid 2. The functional cover or lid 2 is a compact part of the screening casing 1 in a manufacturing process and in the manufactured casing containing the electrical functional element inside. A basis or a framework for the cover or lid 2 is die-cut during the manufacturing process to the plate from which the screening casing 1 is formed. A detail 3 shows V-shaped grooves (4 on top, 5 below) which are made to the screening casing 1 in the manufacturing process. The grooves are made to the both sides of the screening casing plate in three positions of the top surface of the screening casing 1 as described in detail later. There is substantially thin film material layer of the plate between the grooves. In some embodiments the material layer can, for example, be approximately 0.05 mm. Other variations having the same property in respect of, e.g. solidity can be applied as well. Advantageously, the thin layer of material between the grooves 4 and 5 will break relatively easily, for example by lifting or pressing the formed cover or groove. Alternatively, U-shaped grooves can be applied, however, it should be noted that since V-shape has a sharp edge, it increases the probability to break. Therefore, a thinner layer should be applied in this U-shaped case. Also alternatively, the groove 4 on top or the groove 5 on bottom can be deeper in such a way that only a single groove is required for substantially weaken the groove position for the breaking purposes.

Still referring to the example of FIG. 1, the cover or the lid 2 has stiffening 7 as shown in detail 6. The stiffening 7 is provided on the area of the cover 2 for preventing bending or twisting of the cover 2. This is relevant when the cover 2 is opened or closed and when the three breaking positions are broken as the cover 2 is either lifted or pressed. The stiffening 7 can be longitudinal, cross, or even a mixture of both. It is important that the cover 2 be substantially stiff for opening the cover 2 so that the cover 2 does not become too flimsy when it is opened. If the cover 2 is too flimsy, this will complicate the opening process. The stiffening 7 aids the cover 2 to maintain the form when the casing is opened. The situation is substantially similar when the cover 2 is closed after the cover has been opened. The stiffening 7 aids the cover 2 to maintain the shape and design for being applicable to close the cover 2 in such a way that the cover 2 substantially fits to the housing, especially to the groove 4 release positions.

Still referring to the example of FIG. 1, the manufactured grooves 4 are shown on top of the screening casing 1. The grooves 4 (and possibly of course the groove 5 below the surface) and a hinging groove 9 shown in the detail 8 establish the cover 2, in such a way that the cover 2 is a complete integral part of the screening casing 2 when the screening casing 1 is manufactured. In some embodiments the hinge and accordingly the corresponding hinging groove can be positioned in another place. For example, long side or longer side can act as the hinge as well as any shorter side. For another example, any shorter or short side can act as the hinge as well as any longer side. The FIG. 1 is depicted as an example only, and should not pose any limitations in respect of positioning of the hinge. The cover 2 will be detached from the casing at the groove positions 4/5, and the hinging groove 9 as shown on detail 8 about the hinging groove position acts as a hinge for the cover 2 when the casing is opened. The hinging groove 9 has smaller depth and establishes a stronger bond in such a way that the groove 9 can act as the hinge, and the material layer coinciding with the hinging groove does not easily break. The groove 9 is below the surface also for strengthening the hinge. There is a single groove 9 on the hinge position situated below the cover surface. Moreover, the bottom of the groove can be rounded so that the hinge will not break easily. The material layer remaining on the plate coinciding with the hinge position 8 can be approximately 0.10 mm. On the hinged groove position 8, the material on top of the surface can be distended.

Figure 2:
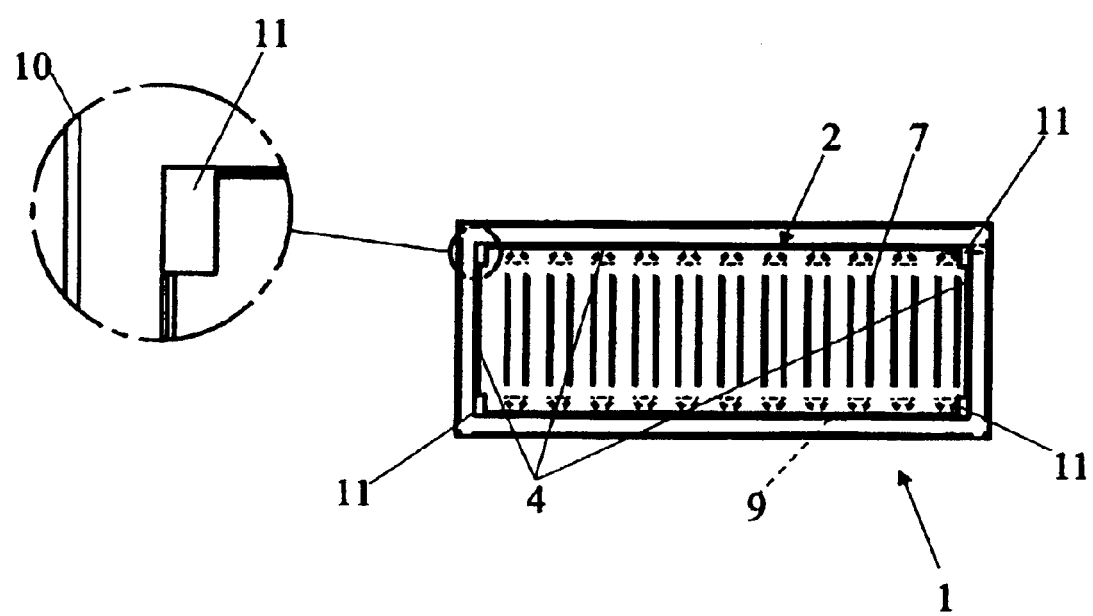
FIG. 2 depicts a diagram of a the casing seen from above in accordance with an embodiment of the invention.

FIG. 2 has been described in the foregoing. In the following, corresponding reference signs have been applied to corresponding parts. The exemplary FIG. 2 depicts a diagram of the casing seen from top. The manufactured grooves 4 are shown on top of the screening casing 1. The groove 9 is situated below the casing surface and may not be visible but it coincides between the longitudinal grooves 4 at the other ends. In some embodiments the hinge and accordingly the corresponding hinging groove can be positioned in another place. For example, long side or longer side can act as the hinge as well as any shorter side. For another example, any shorter or short side can act as the hinge as well as any longer side. The FIG. 2 is depicted as an example only, and should not pose any limitations in respect of positioning of the hinge. The grooves 4 (and possibly of course the groove 5 below the surface) and the hinging groove 9 establish the cover 2, which is a complete integral part of the screening casing 1 when the screening casing 1 is manufactured. The cover 2 will be detached from the casing at the groove positions 4, and the groove 9 acts as a hinge for the cover 2 when the casing is opened or closed. The hinging groove 9 has smaller depth, and it establishes a stronger bond in such a way that the groove 9 can act as the hinge. The groove 9 may be below the surface also for strengthening the hinge. There can be the single groove 9 on the hinge position situated below the cover surface. Moreover, the bottom of the groove is rounded so that the hinge will not break easily. The material layer remaining on the hinge position coinciding with the hinging groove 9 can, for example, be approximately 0.10 mm. On the hinging groove 9 or alternatively referred to as the hinged groove position, the material on top of the surface can be distended.

Still referring to the example of FIG. 2, the top of the screening casing 1 has four openings 11 at the corner of the cover 2 as shown in detail 10. Preferably, the size of the openings 11 is such that one can insert a spike or a needle inside the screening casing 1 for opening the cover 2, for example, about 1 mm×1 mm or 1 mm×1.5 mm. The shape of the openings 11 can be a triangle, a square, a circular or a rectangle so that the spike can be plugged into the casing 1 and that the cover 2 will be released from the three groove positions 4 and/or 5. Thus, the openings 11 will aid to release the groove positions 4 and/or 5 when the cover 2 is opened.

Figure 3A:
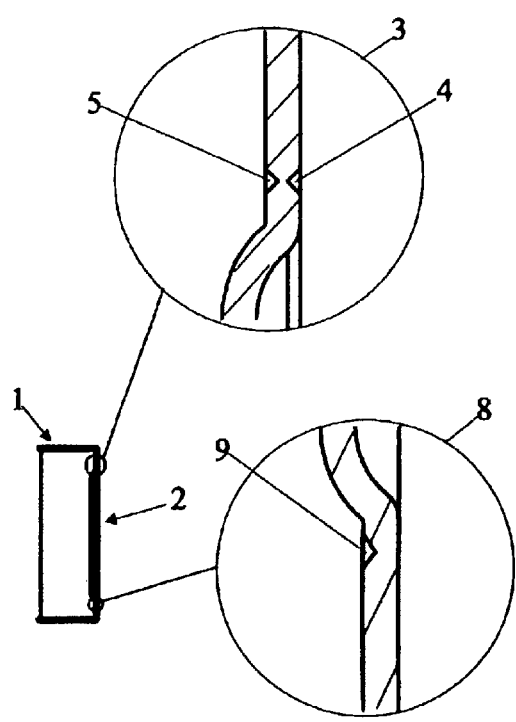
FIG. 3a depicts a cross-section diagram of the casing where the casing is closed in accordance with an embodiment of the invention.
Figure 3B:
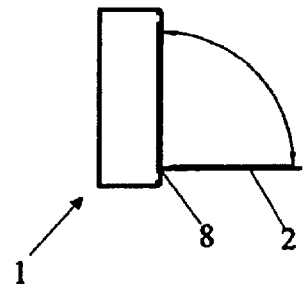
FIG. 3b depicts a cross-section diagram of the casing where the casing is opened in accordance with an embodiment of the invention.
Figure 3C:
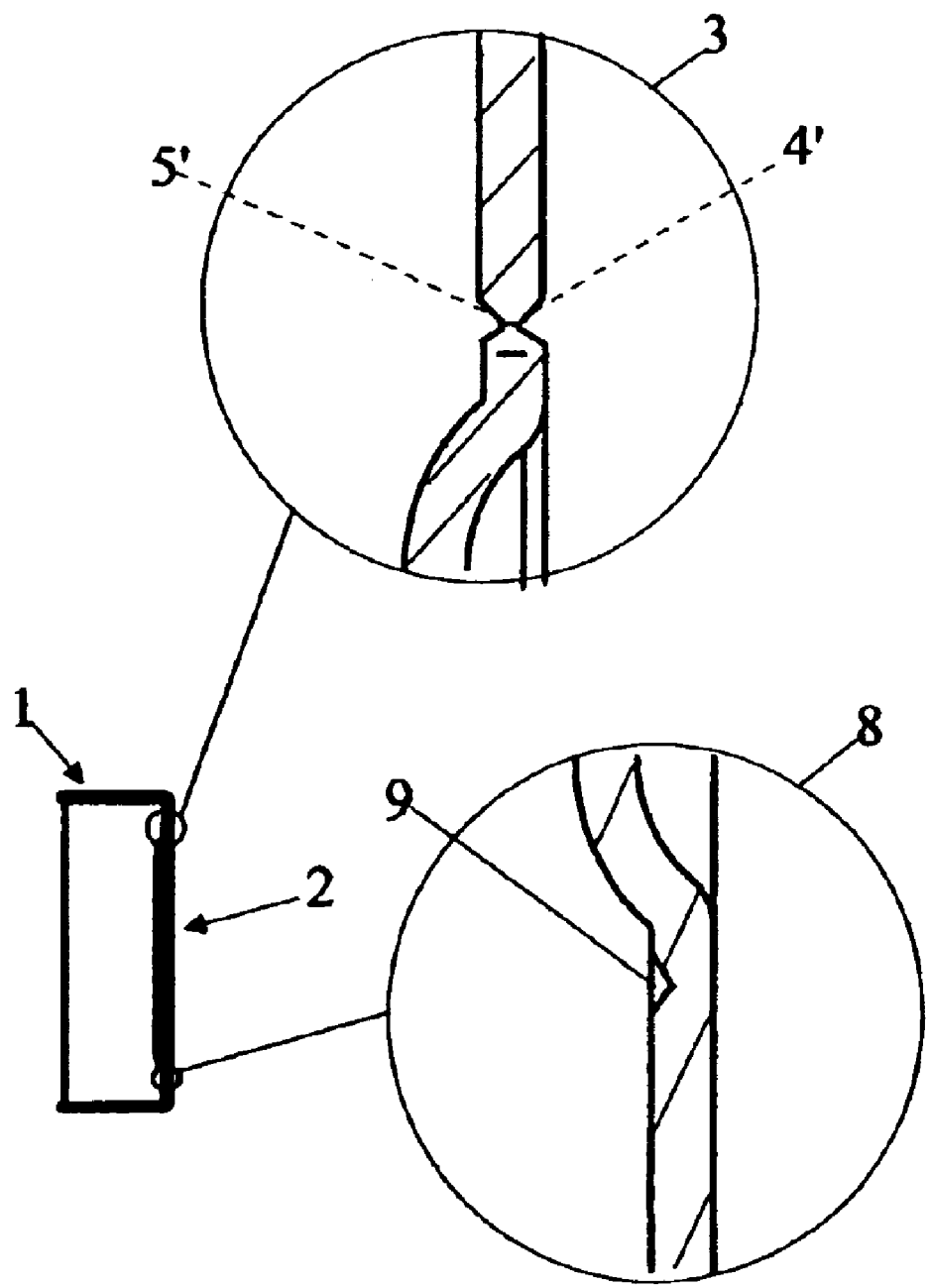
FIG. 3c depicts a cross-section diagram of the casing where the cover is closed after it has been released for opening in accordance with an embodiment of the invention.

FIGS. 3a, 3b and 3c have been described in the foregoing. In the following, corresponding reference signs have been applied to corresponding parts. The exemplary FIG. 3a depicts a cross-section diagram of the casing where the casing is closed. The cover 2 is not yet opened in the FIG. 3a. The material between the groves 4 and 5 is still intact. After the manufacturing process is finished, the casing is in the situation of FIG. 3a. The casing contains the electrical function element inside and the groove 4 positions are intact. The casing 1 acts as a protecting entity either for the electrical component inside the casing or for the environment surrounding the casing. If a need for "fingering" the electrical component is arisen, the cover 2 can be opened.

The cover 2 is lifted or pressed in such a way that the bond in the groove 4 position will give up. The cover 2 will be released from these positions. However, since the bond is stronger at the hinge groove 9 position, this will not easily break but bends acting as a hinge for the cover 2. The openings 11 help this opening process.

The exemplary FIG. 3b depicts a cross-section diagram of the casing where the casing is opened. As shown in the FIG. 3b, the groove 9 acts as a hinge and the material coinciding with the grooves 4 and/or 5 have been broken. The cover 2 can be opened or closed. Advantageously, the electrical functional element inside the screening casing is now available for, for example maintenance or replacement purposes.

The exemplary FIG. 3c depicts a cross-section diagram of the casing where the cover is closed after it has been released for opening. When the cover 2 is opened, the cover 2 can be moved to the closed position, for example after the maintenance or replacement operations has been completed. The cover 2 can be bent to the closed position. The cover 2 is connected to the housing of the casing 1 by the hinging point 8, and the released groove positions 4' and/or 5' are disconnected. For ensuring the electrical shielding or fire safety, the cover 2 can be soldered to the housing part of the casing 1 at the groove position 4' when needed. It should be noted that the material can typically be stretched when released, however, this can be advantageously closed by bending the cover 2 to the place to which it substantially coincide with.

Figure 4A:
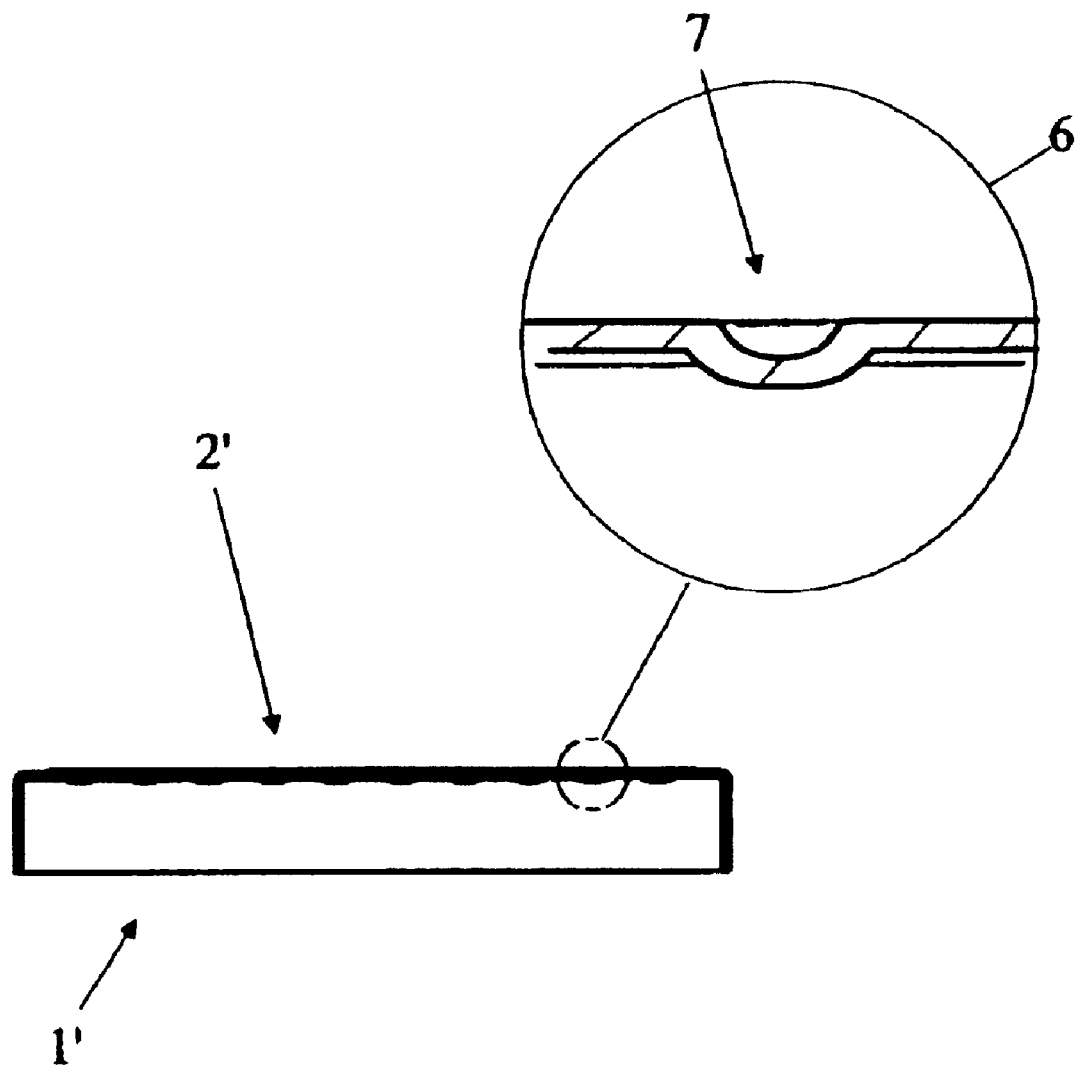
FIGS. 4a and 4b depict a cross-section diagram of a casing in accordance with further embodiments of the invention.
Figure 4B:
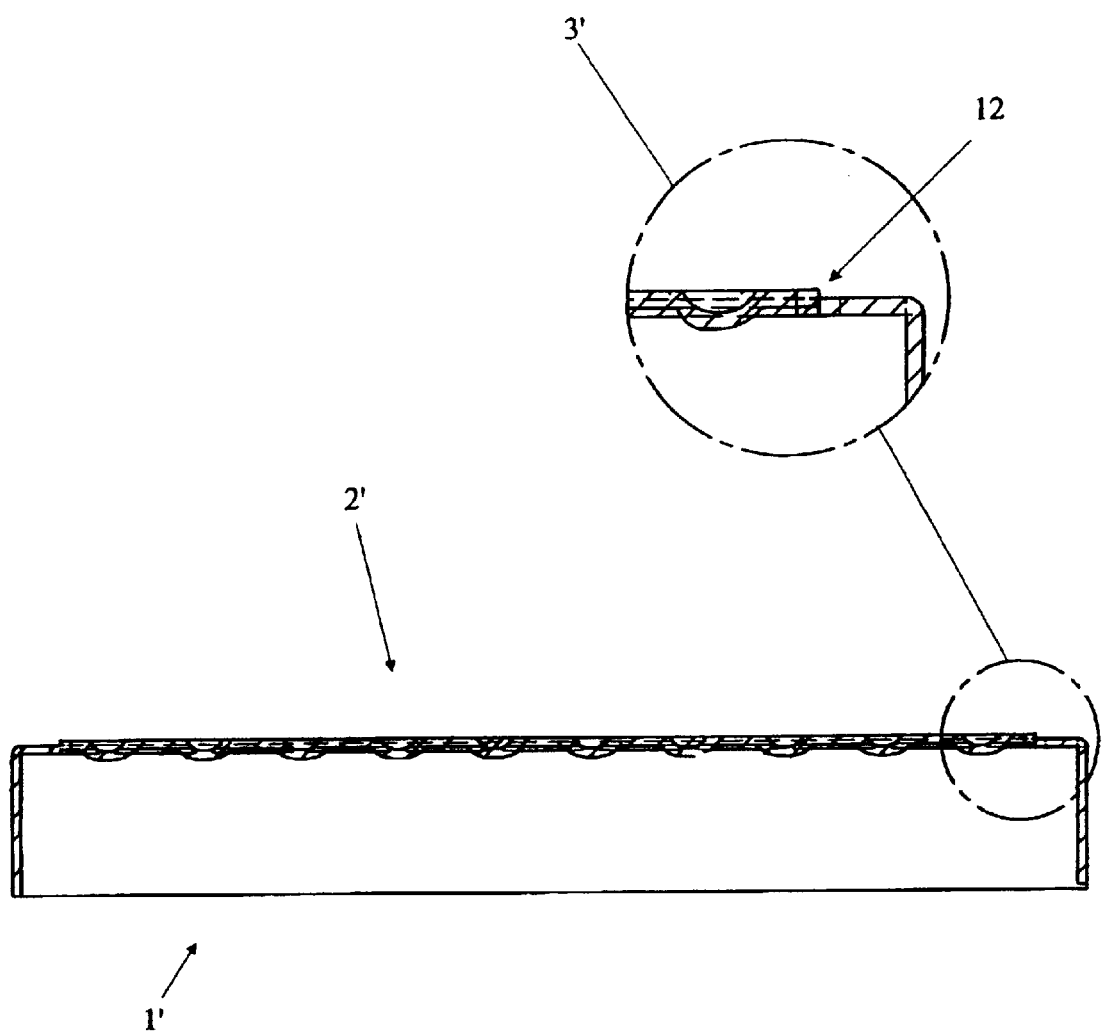

FIGS. 4a and 4b have been described in the foregoing. In the following, corresponding reference signs have been applied to corresponding parts. FIGS. 4a and 4b show a screening casing 1' for accommodating the electronic functional element in accordance with the further embodiment. The screening casing 1' has a functional cover or lid 2'. The functional cover or lid 2' is a compact part of the screening casing 1 in a manufacture process and in the manufactured casing containing the electrical functional element inside. A basis or a framework for the cover or lid 2' is hit or pressed during the manufacturing process to the plate from which the screening casing 1 is formed. Alternatively, the edge of the cover is broken from three sides in such a way that the contact is still maintained. A detail 3' shows a position 12 on which the plate is weaken in the manufacturing process. Advantageously, the thin layer of material on the weaken position 12 will break relatively easily, for example by lifting or pressing the formed cover or groove.

Still referring to the example of FIGS. 4a and 4b, the cover or the lid 2' has also the stiffening 7 as shown in detail 6. The stiffening 7 is provided on the area of the cover 2' for preventing bending or twisting of the cover 2'. This is relevant when the cover 2' is opened or closed and when the three breaking positions are broken as the cover 2' is either lifted or pressed. The stiffening 7 can be longitudinal, cross, or even a mixture of both. It is important that the cover 2' be substantially stiff for opening the cover 2' so that the cover 2' does not become too flimsy when it is opened. If the cover 2' is too flimsy, this will complicate the opening process. The stiffening 7 aids the cover 2' to maintain the form when the casing is opened. The situation is substantially similar when the cover 2' is closed after the cover has been opened. The stiffening 7 aids the cover 2' to maintain the shape and design for being applicable to close the cover 2' in such a way that the cover 2' substantially fits to the housing, especially to the weakening release positions.

Still referring to the example of FIGS. 4a and 4b, the weakening positions manufactured on the plate and a hinging groove establish the cover 2', in such a way that the cover 2' is a complete integral part of the screening casing 1' when the screening casing 1' is manufactured. The cover 2' will be detached from the casing at the weakening positions 3', and the hinging groove about the hinging groove position acts as a hinge for the cover 2' when the casing 1' is opened. The hinging groove has small depth, and established a stronger bond in such a way that the groove can act as the hinge and the material layer coinciding with the hinging groove does not easily break. The groove is below the surface also for strengthening the hinge. There is a single groove on the hinge position situated below the cover surface. Moreover, the bottom of the groove can be rounded so that the hinge will not break easily. The material layer remaining on the plate coinciding with the hinge position 8 can be thinned or weakened. In some further examples the material remaining there can, for example, be approximately 0.10 mm. On the hinged groove position, the material on top of the surface can be distended.

Figure 5:
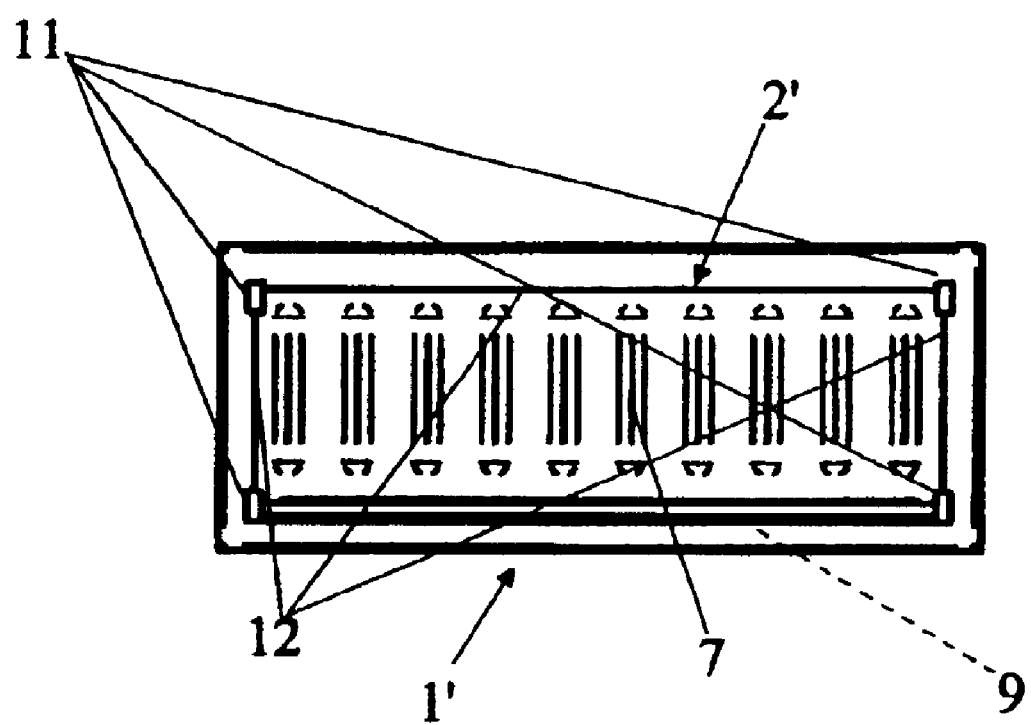
FIG. 5 depicts a diagram of a the casing seen from above in accordance with a further embodiment of the invention.

FIG. 5 has been described in the foregoing. In the following, corresponding reference signs have been applied to corresponding parts. The exemplary FIG. 5 depicts a diagram of the casing 1' seen from top. The weakening positions 12 are shown on top of the screening casing 1'. The groove 9 can be situated below the casing surface and it is not visible but it coincides between the weakening positions 12 at the other ends. In some embodiments the hinge and accordingly the corresponding hinging groove can be positioned in another place. For example, long side or longer side can act as the hinge as well as any shorter side. For another example, any shorter or short side can act as the hinge as well as any longer side. The FIG. 5 is depicted as an example only, and should not pose any limitations in respect of positioning of the hinge. The lines 12 and the hinging groove 9 establish the cover 2', which is a complete integral part of the screening casing 1' when the screening casing 1' is manufactured. The cover 2' will be detached from the casing at the weakening positions 12, and the groove 9 acts as a hinge for the cover 2' when the casing is opened or closed. The hinging groove 9 has small depth, and it establishes a stronger bond than the manufactured weakened breaking positions 12 in such a way that the groove 9 can act as the hinge. The groove 9 can be below the surface also for strengthening the hinge. There may be the single groove 9 on the hinge position situated below the cover surface. Moreover, the bottom of the groove is rounded that the hinge will not break easily. The material layer remaining on the hinge position 8 can be approximately 0.10 mm. On the hinged groove position 8, the material on top of the surface can be distended.

Still referring to the example of FIG. 5, the top of the screening casing 1' has four openings 11 at the corner of the cover 2' as shown in detail 10. Preferably, the size of the openings 11 is such that one can insert a spike or a needle inside the screening casing 1' for opening the cover 2', for example, about 1 mm×1 mm or 1 mm×1.5 mm. The shape of the openings 11 can be a triangle, a square or a rectangle so that the spike can be plugged into the casing 1' and that the cover 2' will be released from the three weakened breaking positions 12. Thus, the openings 11 will aid to release the positions 12 when the cover 2' is opened.

If a need for "fingering" the electrical component is arisen, the cover 2' can be opened. The cover 2' is lifted or pressed in such a way that the bond in the breaking positions 12 will give up. The cover 2' will be released from these positions. However, since the bond is stronger at the hinge groove 9 position 8, this will not easily break but bends acting as a hinge for the cover 2'. The openings 11 help this opening process.

Figure 6A:
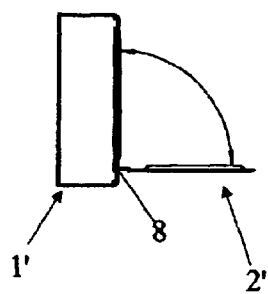
FIG. 6a depicts a cross-section diagram of the casing where the casing is opened in accordance with a further embodiment of the invention.

The exemplary FIG. 6a depicts a cross-section diagram of the casing where the casing is opened. As shown in the FIG. 6b, the groove 9 acts as a hinge and the material coinciding with the breaking positions 12 have been broken. The cover 2' can be opened or closed. Advantageously, the electrical functional element inside the screening casing is now available for, for example maintenance or replacement purposes.

Figure 6B:
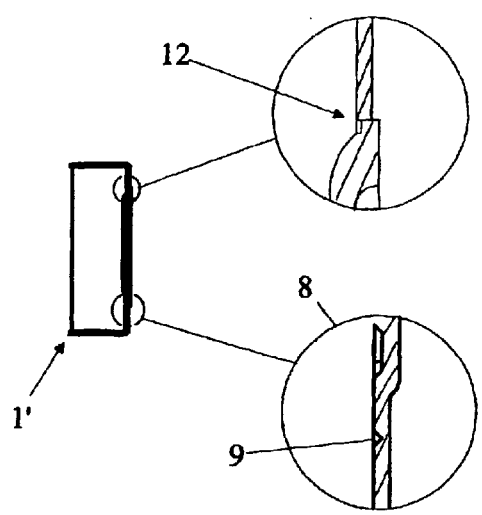
FIG. 6b depicts a cross-section diagram of the casing where the casing is closed in accordance with a further embodiment of the invention.

The exemplary FIG. 6b depicts a cross-section diagram of the casing where the cover 2' is closed after it has been released for opening. When the cover 2' is opened, the cover 2' can be moved to the closed position, for example after the maintenance or replacement operations has been completed. The cover 2' can be bent to the closed position. The cover 2' is connected to the housing of the casing 1 by the hinging point 8, and the released breaking positions 12 are disconnected. For ensuring the electrical shielding or fire safety, the cover 2' can be soldered to the housing part of the casing 1 at the breaking positions 12 when needed.

An applicable tool for manufacturing the breaking position, i.e. the grooves, can be an automatic stamping tool, which can be processed to manufacture the plate, for example in a series of one stage processes. Only a single tool is required for manufacturing the entire shielding casing.

Some preferred embodiments were discussed with the above description of casings and parts thereof also relates to components which act both as electrical and mechanical carriers and casings, for example, a printed wiring boards, or alternatively referred to as a printed circuit board which is simultaneously used as a casing part.

Thus, the proposed solution also applies to profiles of layers in the form of cap, grid, or basket provided in screening devices or parts thereof.

In some various embodiments of the invention, the material can be made of a plate having small holes or, in yet further examples, micro-sized holes. For example, the material of the plate from which the screening casing is manufactured can be perforated plate. There can be numerous holes that the entire plate, or that part establishing the solder position, is made of such a way. When the soldering is performed, the soldering material such as tin flows or drains through the holes. The tin can drain to the components inside the screening casing in order to solder appropriately. The tin does not necessary have to solder the can or the shielding screening itself now.

It should be noted that there can be several weakening lines such as grooves and groove positions to establish the cover. Depicted examples of the square shape of the cover having four weakening lines are given as some examples only. The invention is not limited to the amount of four weakening lines, and they can be from at least three to various lines depending on the appropriate design of the screening casing. Also, the positioning of the hinge, or the hinging groove in some embodiments, can vary in such a way that a side of the used sides acts as the binge.

Particular implementations and embodiments of the invention have been described. It is clear to a person skilled in the art that the invention is not restricted to details of the embodiments presented above, but that it can be implemented in other embodiments using equivalent means without deviating from the characteristics of the invention. The scope of the invention is only restricted by the attached patent claims. Consequently, the options of implementing the invention as determined by the claims, including the equivalents, also belong to the scope of the present invention.

What is claimed is:

1. A one-piece manufactured shielding casing for accommodating electronic functional elements, comprising:
a functional lid which is adapted to be manufactured to said one-piece manufactured shielding casing in such a way that said lid comprises a functional part of said one-piece manufactured shielding casing, and said lid can be breakably and releasably opened yet maintaining a bendable hinge, said lid is outlined by grooves for being breakably released, said breakably releasable grooves being manufactured to a plate from which said shielding casing is manufactured in such a way that material of said plate is thinned to form said breakably releasable grooves and coincide with said functional lid, and a groove is manufactured to said plate establishing said bendable hinge for said functional lid.

2. A shielding casing according to claim 1, wherein said lid comprises weakening lines in said shielding casing being breakably released and a stronger weakening line in said shielding casing establishing said bendable hinge, wherein said lines establish said functional lid.

3. A shielding casing according to claim 1, wherein said breakably releasable grooves are manufactured on both sides of said plate.

4. A shielding casing according to claim 1, wherein said groove establishing said bendable hinge is below a top surface of said lid of said shielding casing.

5. A shielding casing according to claim 1, wherein said groove establishing said bendable hinge is upon a top surface of said lid of said shielding casing.

6. A shielding casing according to claim 1, wherein said groove establishing said bendable hinge is according to a dash line along a top surface of said lid of said shielding casing.

7. A shielding casing according to claim 1, wherein, when opening said lid, said groove establishing said bendable hinge establishes a stronger bond for acting as the bendable hinge and the breakably releasable grooves break releasing said lid from three sides from said shielding casing.

8. A shielding casing according to claim 1, wherein intersections of the breakably releasable grooves contains openings for breakably releasable opening of said lid.

9. A shielding casing according to claim 8, wherein said openings are dimensionally sized such that a spike can be inserted inside said screening casing.

10. A shielding casing according to claim 8, wherein shape of said openings is chosen from the group consisting of a triangle, a square, a circular and a rectangle.

11. A shielding casing according to claim 1, wherein said breakably releasable grooves comprise V-shaped grooves for increasing a probability to break.

12. A shielding casing according to claim 11, wherein material remaining on a plate, from which the shielding casing is manufactured, along the V-shaped grooves is approximately 0.05 mm.

13. A shielding casing according to claim 1, wherein said groove establishing said bendable hinge is rounded at a bottom of said groove.

14. A shielding casing according to claim 1, wherein said groove establishing said bendable hinge comprises U-shaped groove for being bendable and not relatively easily broken.

15. A shielding casing according to claim 14, wherein material remaining on a plate, from which the shielding casing is manufactured, on the groove establishing said bendable hinge is approximately 0.1 mm.

16. A shielding casing according to claim 1, wherein said lid contains stiffening for preventing said lid from twisting.

17. A shielding casing according to claim 16, wherein said stiffening is chosen from a group consisting of longitudinal, cross, a mixture of both, and a honeycomb.

18. A shielding casing according to claim 1, wherein said lid contains stiffening for preventing said lid from substantially altering shape.

19. A shielding casing according to claim 18, wherein said stiffening is chosen from a group consisting of longitudinal, cross, a mixture of both and a honeycomb.

20. A shielding casing according to claim 1, wherein said shielding casing is formed of a material chosen from a group consisting of a metal plate, a thin-film plate, a tined steel plate, and a nickel silver plate.

21. A shielding casing according to claim 1, wherein said shielding casing contains the electronic functional elements inside ready for application when manufactured.

22. A shielding casing according to claim 1, wherein said functional lid is manufactured in a plate from which the shielding casing is manufactured by at least one method chosen from a group consisting of die-cutting grooves on said plate, stamping said plate and pressing said plate.

23. A shielding casing according to claim 1, wherein said electronic functional elements are available for maintenance or replacement purposes without a need for removing or replacing the entire shielding casing or said lid.

24. A shielding casing according to claim 1, wherein a single tool is applied in a manufacture process for manufacturing the screening casing comprising said functional lid as said functional part of said shielding casing.

25. A shielding casing according to claim 1, wherein said screening casing is manufactured from a perforated plate.

* * * * *